United States Patent [19]
Hayakawa et al.

[11] Patent Number: 5,276,369
[45] Date of Patent: Jan. 4, 1994

[54] SENSE AMPLIFIER CIRCUIT HAVING A BIAS CURRENT CONTROL MEANS

[75] Inventors: Shigeyuki Hayakawa, Kawasaki; Takayuki Ootani, Tokyo, both of Japan

[73] Assignee: Kabushiki Kaisha Toshiba, Kawasaki, Japan

[21] Appl. No.: 844,890

[22] Filed: Mar. 3, 1992

Related U.S. Application Data

[63] Continuation of Ser. No. 553,587, Jun. 18, 1990, abandoned.

[30] Foreign Application Priority Data

Jul. 20, 1989 [JP] Japan .................. 1-188300

[51] Int. Cl.⁵ .................. H03K 3/29; H03B 1/00
[52] U.S. Cl. .................. 307/530; 307/355; 307/546; 307/290; 330/253; 330/257
[58] Field of Search .......... 330/253, 257; 307/443, 307/448, 451, 530, 546, 290, 355

[56] References Cited
U.S. PATENT DOCUMENTS

| | | | |
|---|---|---|---|
| 4,728,900 | 3/1988 | Nakagawara et al. | 307/530 |
| 4,791,324 | 12/1988 | Hodapp | 307/530 |
| 4,808,857 | 2/1989 | Naito et al. | 307/355 |
| 4,922,461 | 5/1990 | Hayakawa et al. | 365/207 |
| 5,115,153 | 5/1992 | Ducourant | 307/530 |

FOREIGN PATENT DOCUMENTS 63-74518 10/1989 Japan .
63-74519 10/1989 Japan .
62-79161 10/1989 Japan .

*Primary Examiner*—Margaret R. Wambach
*Attorney, Agent, or Firm*—Banner, Birch, McKie & Beckett

[57] ABSTRACT

A sense amplifier circuit characterized by comprising differential amplifying means for amplifying and outputting supplied differential input signals, and bias current control means, connected between the differential amplifying means and a ground voltage, for controlling an amount of bias current in response to the output of the differential amplifying means.

19 Claims, 9 Drawing Sheets

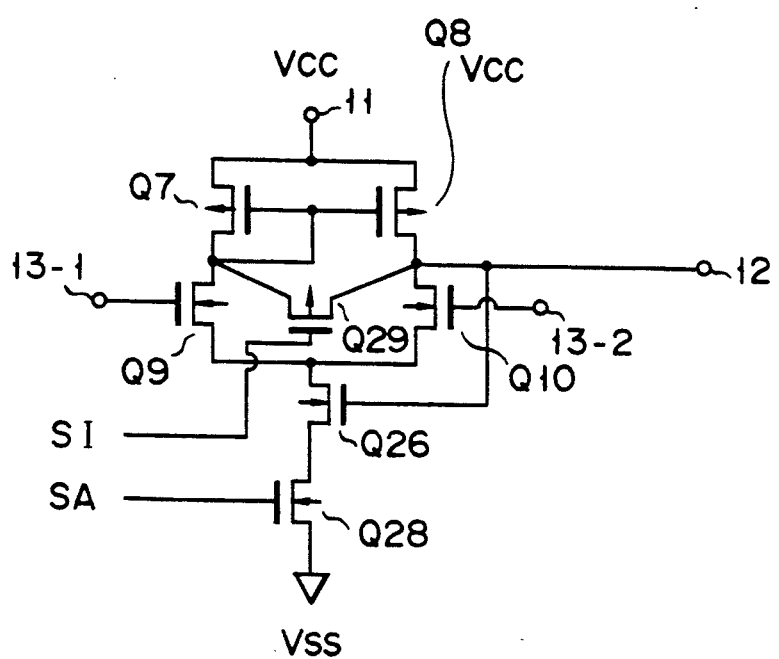
F I G. 12

SENSE AMPLIFIER CIRCUIT HAVING A BIAS CURRENT CONTROL MEANS

This application is a continuation of application Ser. No. 07/553,587, filed Jun. 18, 1990 now abandoned.

BACKGROUND OF THE INVENTION

1. Field of the Invention

This invention relates to a sense circuit especially used as a sense amplifier for amplifying a very small voltage difference read out of a memory cell in a semiconductor memory device.

2. Description of the Related Art

A prior art sense amplifier circuit is shown in FIG. 8. This sense circuit is well known as CMOS current mirror type sense amplifier. It comprises P-channel type MOS FETs Q1 and Q2 constituting a current mirror circuit, N-channel type differential input MOS FETs Q3 and Q4, and an N-channel type MOS FET Q5 functioning as a current source. The MOS FET Q1 has a source, which is connected to a power source terminal 11 which is applied with a power source voltage Vcc. The gate and drain of MOSFET Q1 are commonly connected with a drain of the MOS FET Q3. The MOS FET Q2 has a source which is connected with the power source terminal 11. The gate of MOSFET Q2 is connected with the gate of the MOS FET Q1, and its drain is connected with a drain of the MOS FET Q4 and an output terminal 12. The MOS FET Q3 has a gate which is connected with an input terminal 13-1, and its source is connected with a source of the MOS FET Q4. A gate of the MOS FET Q4 is connected with an input terminal 13-2. The input terminals 13-1 and 13-2 are supplied with differential input signals. The source of MOS FET Q3 is coupled to the source of MOS FET Q4. A MOS FET Q5 is coupled between the sources of MOS FETs Q3 and Q4 and ground. The conductance of MOS FET Q5 is controlled by a sense circuit activation signal SA. Note that the conductance ratio between the MOS FETs Q1 and Q3 is set to be equal to that between the MOS FETs Q2 and Q4.

Now, the operation of the above structured sense amplifier will be explained below. When the sense circuit activation signal SA is in a high level (a higher voltage than a threshold voltage of the MOS FET Q5), the MOS FET Q5 is rendered conductive and the sense circuit is set in an activated state. When the sense circuit activation signal SA is in a low level (a lower voltage than the threshold voltage of the MOS FET Q5), the sense circuit is set in a non-activated state. Therefore, when the voltage of the input terminals 13-1 and 13-2 is set higher than the threshold voltage of the MOS FETs Q3 through Q5 while the signal SA is in a high level, the MOS FETs Q1, Q3 and Q5 are rendered conductive. Thus, a bias current flows between the source and drain of the MOS FET Q1 and the drain of the MOS FET Q1 or the gate of the MOS FET Q2 is biased to an intermediate voltage. The voltage of the output terminal 12 will be equal to the gate bias voltage of the MOS FET Q2 when the voltage of the input terminal 13-2 is equal to that of the input terminal 13-1, because the conductance ratio between the MOS FETs Q2 and Q4 is set to be equal to that between the MOS FETs Q1 and Q3. The voltage of the output terminal 12 will be lower than the gate bias voltage of the MOS FET Q2 when the voltage of the input terminal 13-2 is higher than that of the input terminal 13-1, whereas the voltage of the output terminal 12 will be higher than the gate bias voltage of the MOS FET Q2 when the voltage of the input terminal 13-2 is lower than that of the input terminal 13-1.

FIG. 9 shows another embodiment of a conventional sense circuit. This circuit has the same circuit structure as that shown in FIG. 8 with an additional N-channel type MOS FET Q6, whose drain and source are connected between the source common connection point of the MOS FETs Q3 and Q4 and the drain of the MOS FET Q5. The gate of the MOS FET Q6 is connected with the gate common connection point of the MOS FETs Q1 and Q2.

Due to the above structure, the gate of the MOS FET Q2 is biased to an intermediate voltage as stated above, and the gate of the MOS FET Q6 is applied with the intermediate voltage. Therefore, the MOS FET Q6 functions as a pentode, so that the same current characteristics can be obtained irrespective of the fluctuation of the differential input signals supplied to the input terminals 13-1 and 13-2. Therefore, the current supply capacity can be made constant, and thus provides improved operational stability as compared with the circuit shown in FIG. 8.

However, the circuits shown in FIG. 8 and FIG. 9 consume power very much since a substantially constant bias current always flows in the activated state. To reduce the power consumption, the capacity to drive the load connected with the output terminal 12 will be lowered, which is a drawback.

SUMMARY OF THE INVENTION

The object of the present invention is to provide a sense amplifier which can reduce its power consumption without lowering its driving capacity.

The sense amplifier of this invention is characterized by comprising: a differential amplifying means (Q7, Q8, Q9, Q10) for amplifying and outputting a voltage difference between supplied differential input signals (13-1, 13-2); and a bias current controlling means (Q26, Q28) connected between the differential amplifying means (Q7, Q8, Q9, Q10) and a ground voltage (Vss) for controlling amount of bias current in accordance with the output of the differential amplifying means.

The sense amplifier circuit in this invention aims at reducing the amount of current consumption when the differential amplifying means (Q7, Q8, Q9, Q10) operates in a normal state. The differential amplifying means (Q7, Q8, Q9, Q10) consumes a certain amount of current in its normal operation state. However, the current need not be always flown through the differential amplifying means (Q7, Q8, Q9, Q10), but the restriction of the current flow has no influence upon the operation of the amplifying means. Therefore, the power consumption of the differential amplifying means (14, 15) can be reduced by controlling the amount of the bias current in accordance with the output of the differential amplifying means (14, 15) with the use of the bias current control means (Q26, Q28) connected between the differential amplifying means (14, 15) and the ground voltage (Vss).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 11 and FIG. 12 are circuit diagrams showing still other embodiments of the sense amplifying circuit of this invention.

DETAILED DESCRIPTION OF THE PREFERRED EMBODIMENTS

Figure 1:
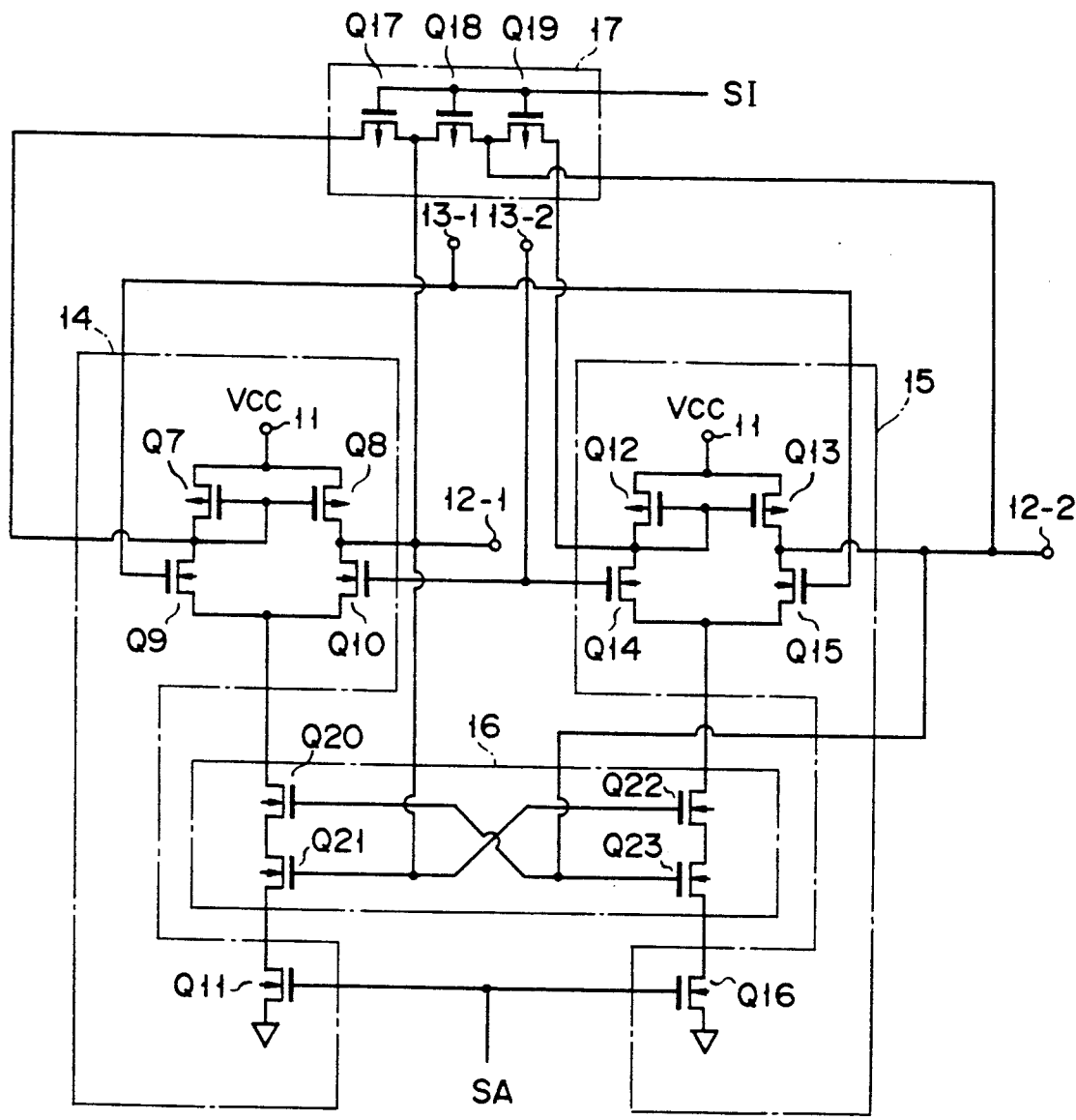
FIG. 1 is a circuit diagram showing one embodiment of the sense amplifying circuit in this invention.

Now, one embodiment of this invention will be explained below with reference to the drawings. FIG. 1 is a circuit diagram showing a sense circuit in accordance with one embodiment of this invention. This sense circuit comprises first and second CMOS current mirror type sense amplifiers 14 and 15 which are supplied with differential input signals, a bias current controlling circuit 16 which is supplied with differential output signals of the sense amplifiers 14 and 15 for controlling bias currents of the sense amplifiers 14 and 15, and an initializing circuit 17 which initializes the sense amplifiers 14 and 15 and the bias current controlling circuit 16.

The first CMOS current mirror type sense amplifier 14 comprises P-channel type MOS FETs Q7 and Q8 constituting a current mirror circuit, N-channel type differential input MOS FETs Q9 and Q10, and an N-channel type MOS FET Q11 functioning as a power source. The second CMOS current mirror type sense amplifier 15 comprises P-channel type MOS FETs Q12 and Q13 constituting a current mirror circuit, N-channel type differential input MOS FETs Q14 and Q15, and an N-channel type MOS FET Q16 functioning as a power source. The bias current controlling circuit 16 comprises N-channel type MOS FETs Q20 through Q23. The initializing circuit 17 comprises P-channel type MOS FETs Q17 through Q19.

The MOS FET Q7 is connected at its source with the power source terminal 11, and at its drain and gate with the drain of the MOS FET Q9. The MOS FET Q8 is connected at its source with the power source terminal 11, at its drain with both the drain of the MOS FET Q10 and the first output terminal 12-1, and at its gate with the gate of the MOS FET Q7. The MOS FET Q9 is connected at its gate with the first input terminal 13-1, and at its source with the source of the MOS FET Q10. The gate of the MOS FET Q10 is connected with the second input terminal 13-2. The MOS FETs Q20, Q21, and Q11 are connected in series between the common source connection point of the MOS FETs Q9 and Q10 and the ground voltage Vss. In the same way, the MOS FET Q12 is connected at its source with the power source terminal 11, and at its drain and gate with the drain of the MOS FET Q14. The MOS FET Q13 is connected at its source with the power source terminal 11, at its drain with both the drain of the MOS FET Q15 and the second output terminal 12-2, and at its gate with the gate of the MOS FET Q12. The MOS FET Q14 is connected at its gate with the input terminal 13-2 and at its source with the source of the MOS FET Q15. The MOS FET Q15 is connected at its gate with the input terminal 13-1. The MOS FETs Q22, Q23, and Q16 are connected in series between the common source connection point of the MOS FET Q14 and Q15 and the ground point Vss. The gate of the MOS FET Q20 is commonly connected with the gate of the MOS FET Q23, and the common gate connection point is connected with the output terminal 12-2. The gate of the MOS FET Q21 and that of the MOS FET Q22 are commonly connected with each other, and the common gate connection point is connected with the output terminal 12-1. The gate of the MOS FET Q11 and that of the MOS FET Q16 are supplied with the sense circuit activation signal SA to control their conductibility.

The MOS FETs Q17 through Q19 are connected in series between the common drain connection point of the MOS FETs Q7 and Q9 and that of the MOS FETs Q12 and Q14. The gate of each of the MOS FETs Q17 through Q19 is supplied with the sense circuit initializing signal SI to control their conductibility. The connection point between the MOS FETs Q17 and Q18 is connected with the output terminal 12-1, and the connection point between the MOS FETs Q18 and Q19 is connected with the output terminal 12-2.

Note that the channel length and channel width of each of the MOS FETs Q7 through Q10, and Q12 through Q15 are set such that the conductance ratio between the MOS FETs Q7 and Q9, the conductance ratio between the MOS FETs Q8 and Q10, the conductance ratio between the MOS FETs Q12 and Q14, and the conductance ratio between the MOS FETs Q13 and Q15 are equal with one another.

Now, the operation of the above structured circuit will be explained. First of all, the sense circuit activation signal SA turns to be in a high level (the power source voltage Vcc level), and the sense circuit initializing signal SI turns to be in a low level (the ground voltage Vss level), so that the sense amplifiers 14 and 15 are activated and the MOS FETs Q7 through Q23 are all rendered conductive. As a result, the output terminals 12-1 and 12-2 are set to have an intermediate voltage V1. After that, when the sense amplifier initializing signal SI turns to be in a high level, the MOS FETs Q17 through Q19 are rendered non-conductive, and the current mirror type sense amplifiers 14 and 15 drive the output terminals 12-1 and 12-2 in accordance with the input voltage supplied to the complementary type input terminals 13-1 and 13-2. As a result, one of the output terminals changes to have a lower voltage than the bias voltage V1, the equivalent resistance of one of the MOS FETs Q20 and Q21 in the bias current control circuit 16 increases, and the current consumption of the current mirror type sense amplifier 14 decreases. At the same time, either the MOS FET Q22 or Q23 will increase in its equivalent resistance when either the MOS FET Q20 or Q21, whose gate is connected with the gate of the MOS FET Q23 or Q22, increases in its equivalent resistance, and the current consumption of the current mirror type sense amplifier 15 will also reduce.

In this structure, the first and second CMOS current mirror type sense amplifiers 14 and 15 are decreased in their bias current by the bias current controlling circuit 16 when the output of the output terminal 12-1 and that of the output terminal 12-2 are determined, so that the current consumption can be reduced without decreasing the driving capability of the output terminals 12-1 and 12-2.

Figure 2:
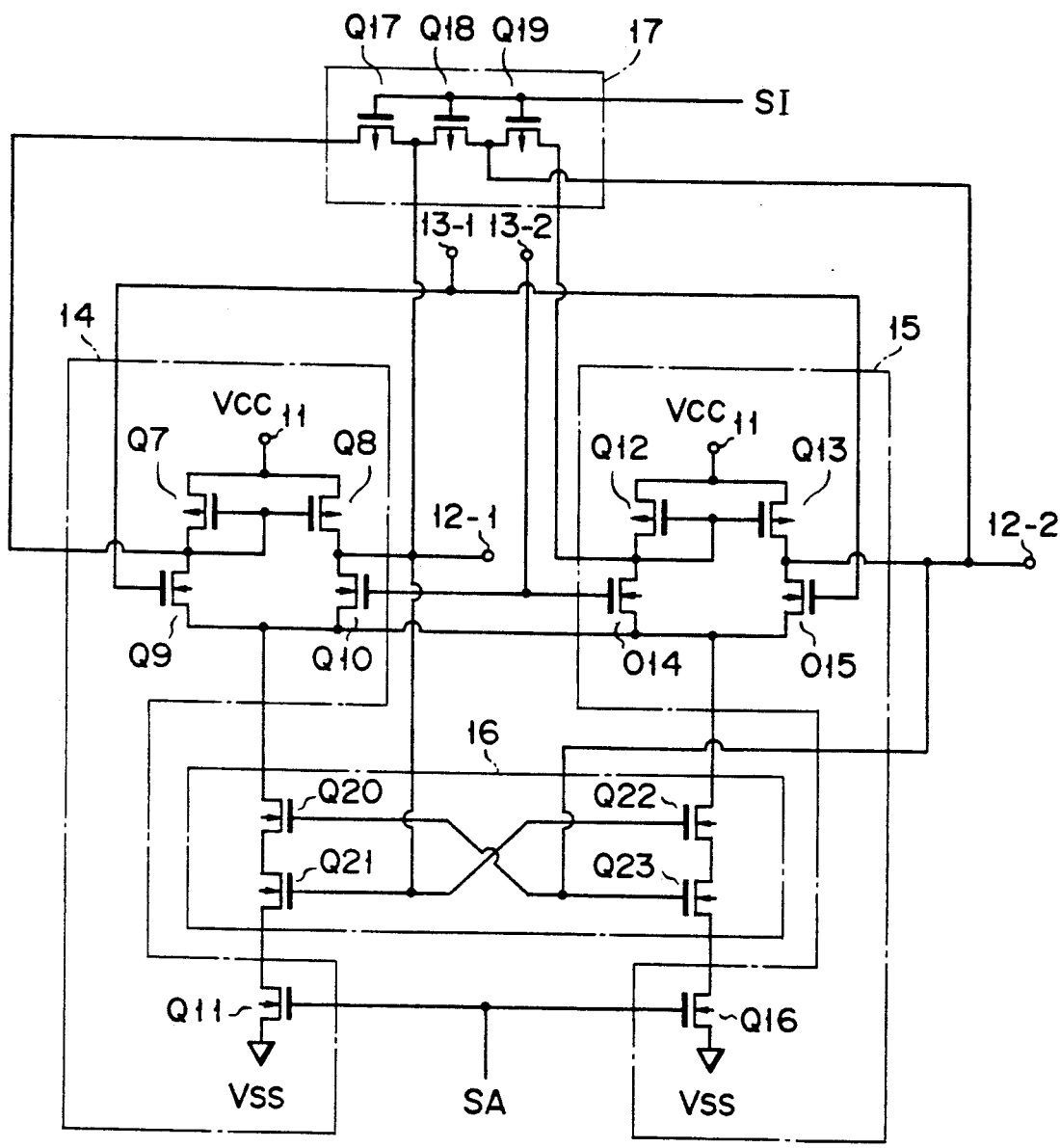
FIG. 2 through FIG. 7 are circuit diagrams showing another embodiments of the sense amplifying circuit in this invention.

FIG. 2 shows a sense circuit in accordance with the second embodiment of this invention. In this circuit, the MOS FET Q20 in the circuit of FIG. 1 is connected at its drain with the drain of the MOS FET Q22. In FIG. 2, those structural parts that are the same as those of FIG. 1 are given the same reference numerals and their detailed explanation will be omitted.

Even in such an altered structure, the operation and result obtained are fundamentally the same as those of the circuit of FIG. 1, except that the drain voltage of the MOS FET Q20 always has the same value as that of the MOS FET Q22.

Figure 3:
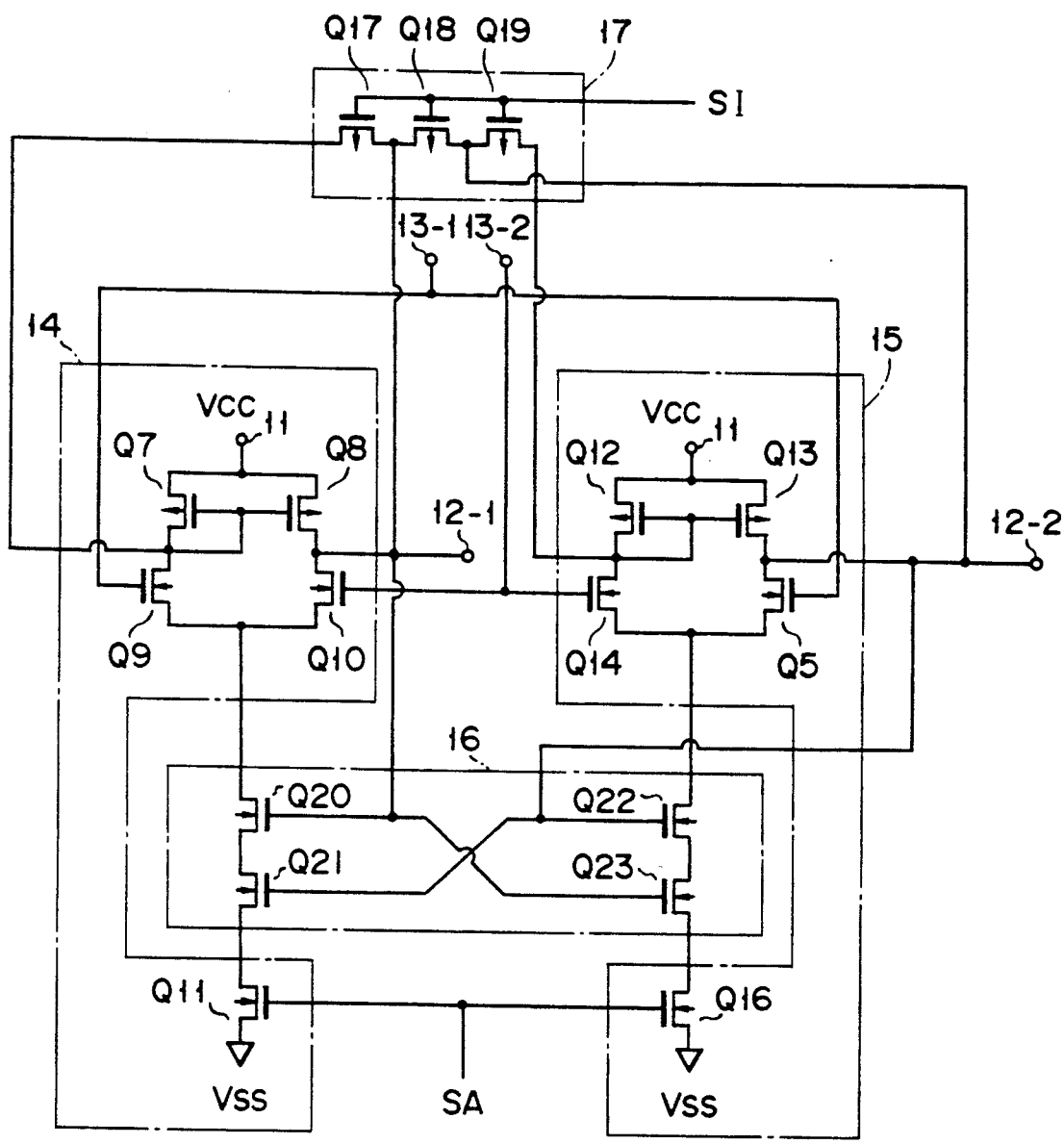

FIG. 3 shows a sense circuit in accordance with the third embodiment. In this circuit, the common gate connection point between the MOS FETs Q21 and Q22 in FIG. 1 is connected with the output terminal 12-2, and the common gate connection point between the MOS FETs Q20 and Q23 is connected with the output terminal 12-1. In FIG. 3, those structural parts that are the same as those shown in FIG. 1 are given the same reference numerals and their detailed explanation will be omitted.

Even in such an altered structure, the operation and result obtained are fundamentally the same as those of the circuit of FIG. 1, except that the MOS FETs Q20 and Q23 are controlled in their conductibility by the output signal of the first current mirror type sense amplifier 14 output from the output terminal 12-1, and that the MOS FETs Q21 and Q22 are controlled in their conductibility by the output signal of the second current mirror type sense amplifier 15 output from the output terminal 12-2.

Figure 4:
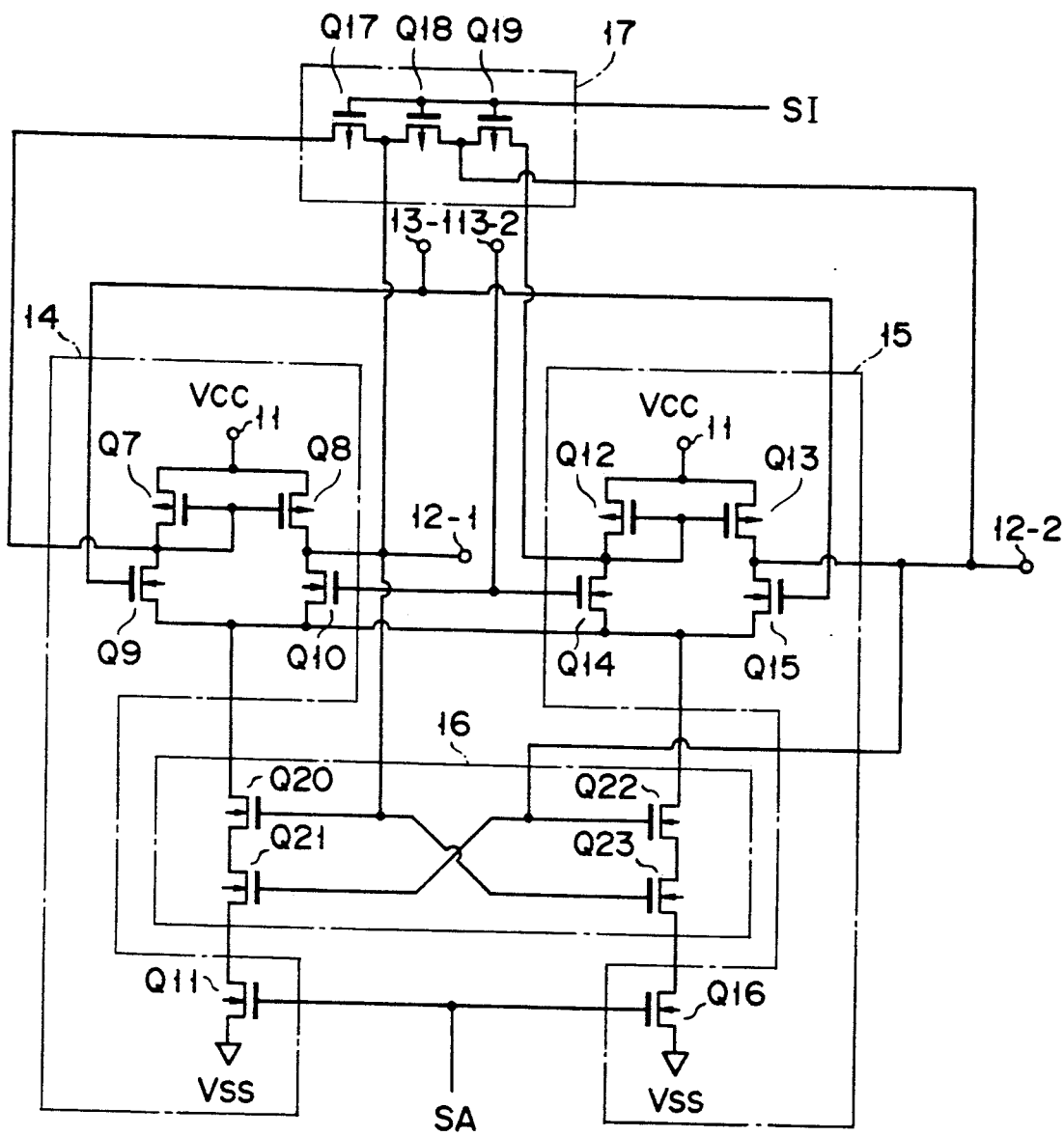

FIG. 4 shows a sense circuit in accordance with the fourth embodiment of this invention. In this circuit, the MOS FET Q20 in the circuit of FIG. 3 is commonly connected at its drain with the drain of the MOS FET Q22. Even in such a structure, the operation and result obtained are fundamentally the same as those of the circuit of FIG. 1, FIG. 2, and FIG. 3, except that unlike the circuit of FIG. 3 the drain voltage of the MOS FET Q20 always has the same value as that of the MOS FET Q22.

Figure 5:
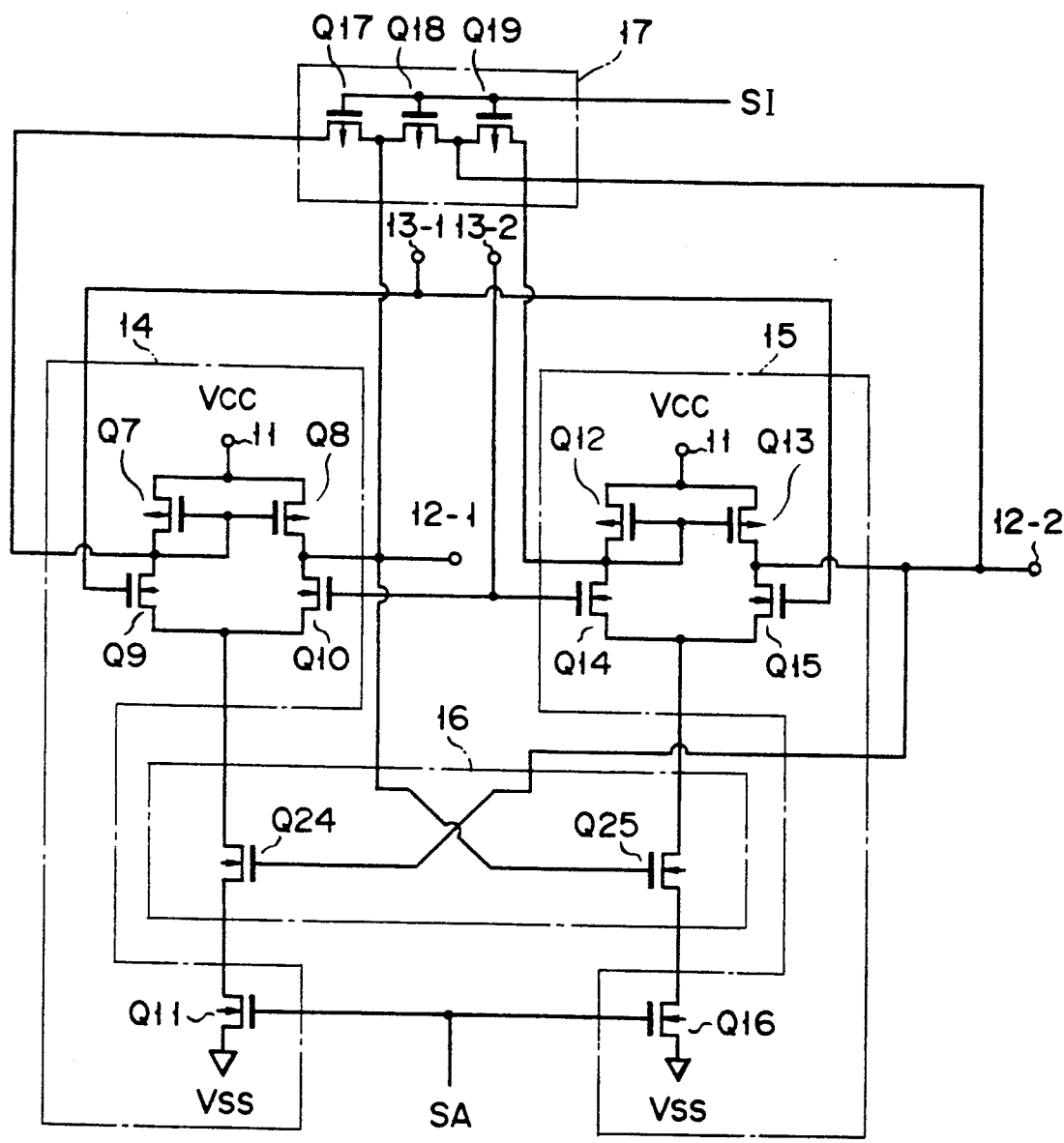

FIG. 5 shows a sense circuit in accordance with the fifth embodiment of this invention. This circuit is different from that of FIG. 1 in that the bias current controlling circuit 16 comprises two N-channel type MOS FETs Q24 and Q25. The MOS FET Q24 is connected at its drain with the common source connection between the MOS FETs Q9 and Q10, at its gate with the output terminal 12-2, and at its source with the drain of the MOS FET Q11. The MOS FET Q25 is connected at its drain with the common source connection between the MOS FETs Q14 and Q15, at its gate with the output terminal 12-1, and at its source with the drain of the MOS FET Q16.

Now, the operation of the sense circuit shown in FIG. 5 will be explained. First of all, when the sense circuit activation signal SA turns to be in a high level and the sense circuit initializing signal SI turns to be in a low level, the sense amplifiers 14 and 15 are activated and the MOS FETs Q7 through Q19 and Q24 and Q25 are all rendered conductive. As a result, the output terminals 12-1 and 12-2 are set to have the same intermediate voltage V2. Then, the sense amplifier initializing signal SI turns to be in a high level, and the MOS FETs Q16 through Q19 are rendered non-conductive. As a result, the sense amplifiers 14 and 15 drive the output terminals 12-1 and 12-2 in accordance with the differential input signal voltages supplied to the complimentary input terminals 13-1 and 13-2. When the signal supplied to the input terminal 13-1 has a higher voltage than that supplied to the input terminal 13-2, for instance, the output terminal 12-1 changes to have a voltage higher than the bias voltage V2, whereas the output terminal 12-2 changes to have a voltage lower than the bias voltage V2. Therefore, the equivalent resistance of the MOS FET Q24 in the bias current controlling circuit 16 increases to decrease the bias current of the current mirror type sense amplifier 14, and thus the output terminal 12-1 is driven to a still higher voltage. In contrast, the equivalent resistance of the MOS FET Q25 decreases to increase the bias current of the current mirror type sense amplifier 15, and thus the output terminal 12-2 is driven to a still lower voltage. When the voltage of the signal supplied to the input terminal 13-1 is lower than the voltage of the signal supplied to the input terminal 13-2, the output terminal 12-1 changes to have a lower voltage than the bias voltage V2, whereas the output terminal 12-2 changes to have a higher voltage than the bias voltage V2. Therefore, the equivalent resistance of the MOS FET Q25, etc., in the bias current controlling circuit 16 increases to decrease the bias current of the current mirror type sense amplifier 15, and thus the output terminal 12-2 is driven to have a still higher voltage. The equivalent resistance of the MOS FET Q24 decreases to increase the bias current of the current mirror type sense amplifier 14, and thus the output terminal 12-1 is driven to have a still lower voltage.

In the above structure, the first and second current mirror type sense amplifiers 14 and 15 consume the same bias current under the condition that the sense circuit is activated and initialized, but, as soon as the sense operation is started and the output terminals 12-1 and 12-2 are driven, one of the sense amplifiers decreases its bias current whereas the other sense amplifier increases its bias current. Therefore, the capability of driving the output terminals 12-1 and 12-2 can be increased. Note that the power consumption increases very little despite the enhanced drive capability, because, even though the bias current of one of the sense amplifiers 14 and 15 increases, the bias current of the other amplifier decreases.

Figure 6:
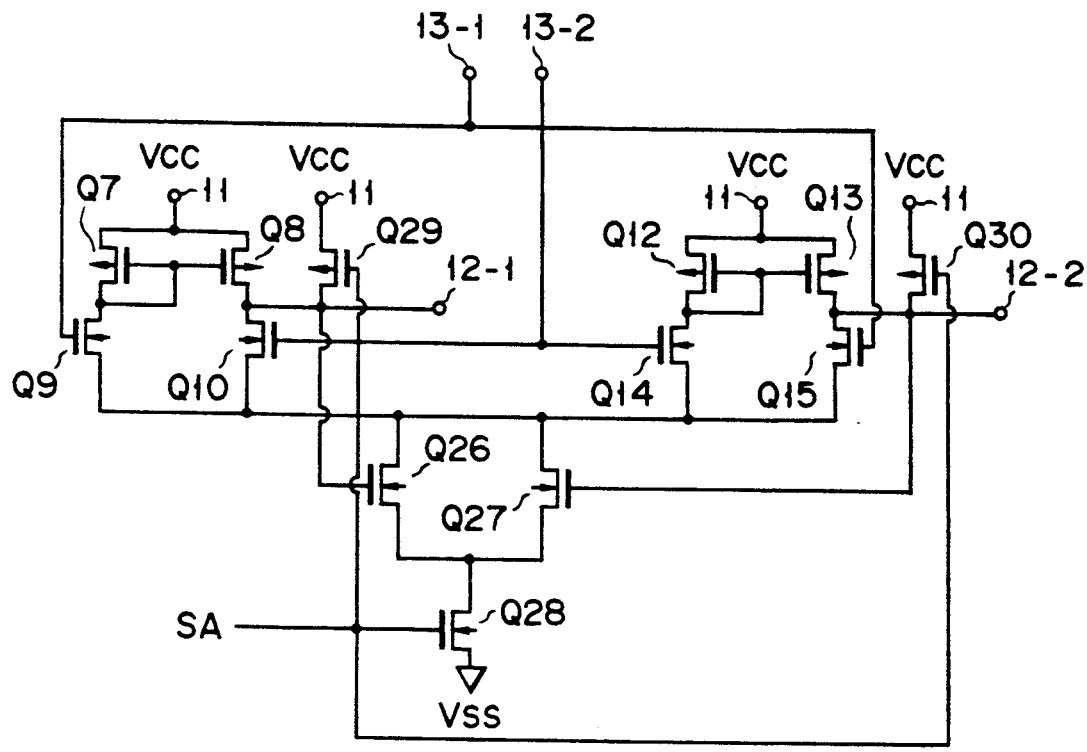

FIG. 6 shows a sense amplifier in accordance with the sixth embodiment of this invention. The MOS FET Q7 is connected at its source with the power source terminal 11, at its drain and gate with the drain of the MOS FET Q9. The MOS FET Q8 is connected at its source with the power source terminal 11, at its drain with both the drain of the MOS FET Q10 and the output terminal 12-1, and at its gate with the gate of the MOS FET Q7. The MOS FET Q9 is connected at its gate with the input terminal 13-1, and its source with the source of the MOS FET Q10. The gate of the MOS FET Q10 is connected with the input terminal 13-2. The MOS FET Q12 is connected at its source with the power source terminal 11, and at its drain and gate with the drain of the MOS FET Q14. The MOS FET Q13 is connected at its source with the power source terminal 11, at its drain with both the MOS FET Q15 and the output terminal 12-2, and at its gate with the gate of the MOS FET Q12. The MOS FET Q14 is connected at its gate with input terminal 13-2, and its source with the source of each of the MOS FETs Q9, Q10, and Q15.

The gate of the MOS FET Q15 is connected with the input terminal 13-1. The drain of the N-channel type MOS FET Q26 and that of the N-channel type MOS FET Q27 are respectively connected with the common source connection point of the MOS FETs Q9 and Q10, and the common source connection point of the MOS FETs Q14 and Q15. The gate of the MOS FET Q26 is connected with the output terminal 12-1, and the gate of the MOS FET Q27 is connected with the output terminal 12-2. The source of the MOS FET Q26 is commonly connected with that of the MOS FET Q27. The N-channel type MOS FET Q28 which is controlled in its conductibility by the sense circuit activation signal SA is connected between the common source connection point of the MOS FETs Q26 and Q27 and the ground point Vss. The P-channel type MOS FETs Q29 and Q30, which are controlled in their conductibility by the sense circuit activation signal SA, are respectively connected between the output terminal 12-1 and the power source terminal 11, and between the output terminal 12-2 and the power source terminal 11.

Note that the channel length and the channel width of each of the MOS FETs Q7 through Q10, and Q12 through Q15 are set, such that the conductance ratio between the MOS FETs Q7 and Q9, the conductance ratio between the MOS FETs Q8 and Q10, the conductance ratio between the MOS FETs Q12 and Q14, and the conductance ratio between the MOS FETs Q13 and Q15 are equal with one another.

In such a structure, the output terminals 12-1 and 12-2 are precharged by the MOS FETs Q29 and Q30 to be in a high level (Vcc level) before the sense circuit is activated, or the sense amplifier activation signal SA is in a low level. Therefore, when the sense amplifier activation signal SA turns to be in a high level and the sense operation is started, the voltage having the Vcc level is applied to the gate of each of the MOS FETs Q26 and Q27 so that conductive resistance is low, which means that the driving force of the sense circuit is strong. Then, one of the output terminals 12-1 and 12-2 decreases in voltage in response to the differential input signals supplied to the input terminals 13-1 and 13-2, and the output is determined. At this moment, the conductance of the MOS FET Q26 or Q27 whose gate is connected with the output terminal 12-1 or 12-2 of the low level side decreases, the power consumption will be decreased.

Figure 7:
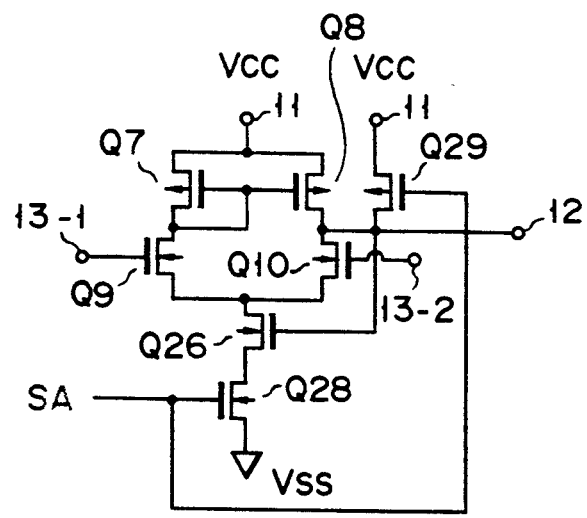
Figure 8:
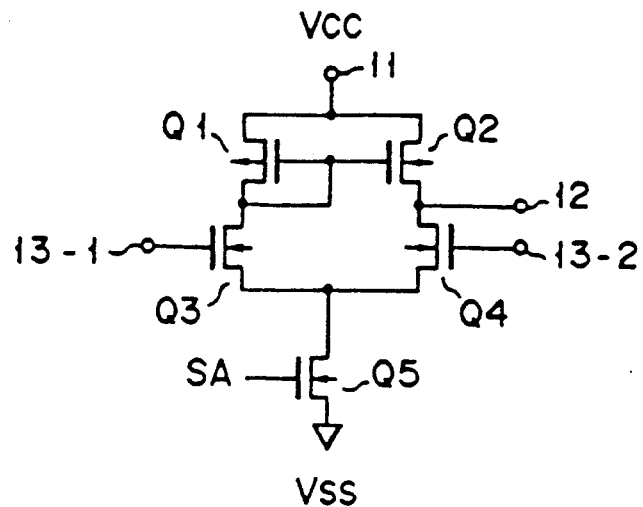
FIG. 8 and FIG. 9, and FIG. 10 are circuit diagrams showing prior art sense amplifying circuits.
Figure 9:
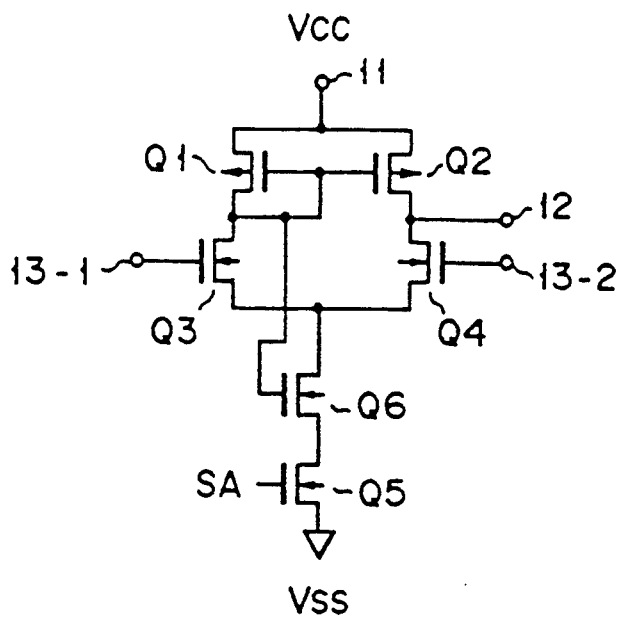

Note that each of the above embodiments uses two current mirror type sense amplifiers to form a sense circuit, but the sense circuit may be formed by using only a single current mirror type sense amplifier as shown in FIG. 7. This circuit can be considered to be one half of the circuit shown in FIG. 6. The MOS FET Q7 is connected at its source with the power source terminal 11, and its drain and gate with the drain of the MOS FET Q9. The MOS FET Q8 is connected at its source with the power source terminal 11, at its drain with both the drain of the MOS FET Q8 and the power source terminal 11, and at its gate with the gate of the MOS FET Q7. The MOS FET Q9 is connected at its gate with the input terminal 13-1, and its source with the source of the MOS FET Q10. The gate of the MOS FET Q10 is connected with the input terminal 13-1. The MOS FETs Q26 and Q28 are connected in series between the common source connection of the MOS FETs Q9 and Q10 and the grounding point Vss. The gate of the MOS FET Q26 is connected with the output terminal 12, and the gate of the MOS FET Q28 is supplied with the sense circuit activation signal SA. The MOS FET Q29 which is controlled in conductibility by the sense circuit activation signal SA is connected between the output terminal 12 and the power source terminal 11.

The operation of the sense circuit shown in FIG. 7 is the same as that of one of the current mirror type sense amplifiers in the sense circuit shown in FIG. 6. The output terminal 12 is precharged to be in a high level (Vcc level) before the sense circuit is activated or the sense amplifier activation signal SA is in a low level. When the sense amplifier activation signal SA turns to be in a high level to start the sense operation, the voltage having the Vcc level is applied to the gate of the MOS FET Q26 and the conductive resistance is low, so that the driving force of the sense circuit is strong. Then, the voltage of the output terminal 12 is maintained at a high level or is decreased to a low level in response to the differential input signal. When the voltage of the output terminal 12 turns to be in the low level, the conductance of the MOS FET Q26 decreases, so that the power consumption can be reduced.

Figure 10:
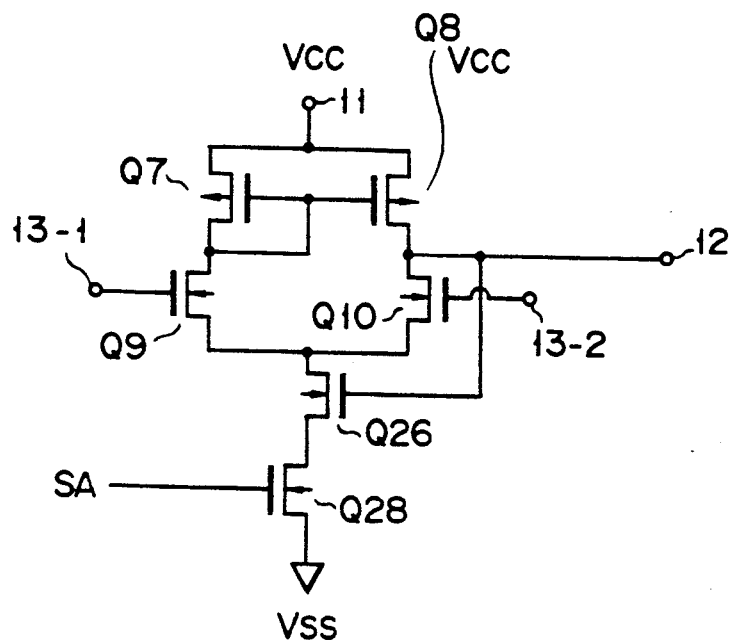
Figure 11:
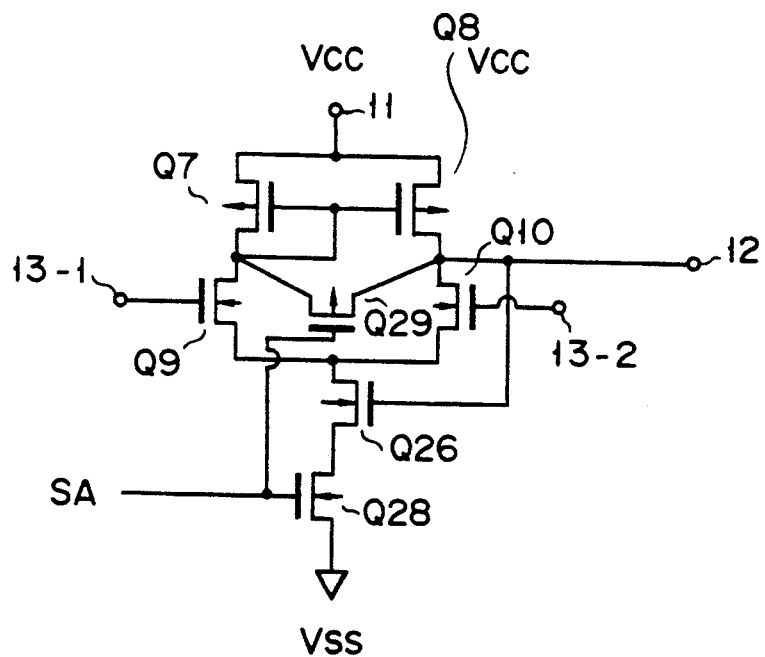

In this sense circuit, the power consumption can be greatly reduced when the output from the output terminal 12 is in a low level, but the power consumption cannot be reduced much when the output from the output terminal is in a high level. However, the high level output and the low level output are alternately provided during the sense operation, so that, when a whole series of the circuit operation is taken into consideration, it may safely be said that the power consumption is reduced in spite of a high driving capability. FIG. 10 illustrates another embodiment of the present invention. A source of MOS transistor Q7 is connected to Vcc power source 11. A drain of MOS transistor Q7 is connected to a gate thereof. A source of MOS transistor Q8 is connected to Vcc power source 11 and a gate thereof is connected to the gate of MOS transistor Q7. A drain of MOS transistor Q9 is connected to the gate of transistor Q7 and a gate thereof is connected to input terminal 13-1. A drain of transistor Q10 is contented to the drain of transistor Q8 and a gate thereof is connected to input terminal 13-2. A source of transistor Q9 is connected to a source of transistor Q10. An output terminal 12 is coupled to a connection point between the drain of MOS transistor Q8 and the drain of MOS transistor Q10. A drain of MOS transistor Q26 is coupled to a connection point between the sources of transistors Q9 and Q10 and a gate thereof is connected to output terminal 12. A drain of transistor Q28 is connected to a source of transistor Q26 and a gate thereof receives a sense amplifier enable signal. A source of transistor Q28 is connected to Vss terminal. FIGS. 11 and FIG. 12 are a circuit diagram showing still another embodiments of the sense amplifying circuit of the present invention.

In FIG. 11, the FET Q29 is inserted between the drain of Q9 and that of Q10 of the embodiment shown in the circuit diagram of FIG. 10. The FET Q29 receives at its gate sense amplifier activation signal SA and is controlled in its operation. When the sense amplifier activation signal SA is in a low level and the sense amplifying operation is not performed, the channel of the FET Q29 is rendered conductive and a short circuit is produced between the source of Q9 and that of Q10, so that the output voltage 12 is reset. When the sense amplifier activation signal SA is in a high level, the sense amplifier is in the operating state, so that the output voltage 12 is never reset needlessly.

Due to the reset function, the presence of an unnecessary voltage will be prevented at the initializing state of the sense amplifier, so that a accurate and stable operation will be obtained.

FIG. 12 is a circuit diagram showing an embodiment having the same circuit structure as that shown in FIG. 11, in which the signal supplied to Q29 is not the sense amplifier activation signal SA but the sense amplifier initializing signal SI. In this embodiment, a most suitable timing for initialization can be set, because Q29 is driven by the sense amplifier initializing signal SI. Therefore, the operational margin for timing can be made large, the occurrence of erroneous operation of the sense amplifier can be suppressed, and the operational stability can be greatly improved.

In the first through fourth embodiments, a certain amount of bias current is consumed when the sense circuit is activated and initialized, but the bias current will decrease as soon as the sense operation is started and the output terminals are driven, so that the low power consumption will be promoted. Note that the driving capability will never be degraded, since it remains the same as that of the conventional circuit until the output is determined.

In the fifth embodiment, the first and second current mirror type sense amplifiers consume the same bias current when the sense amplifiers are activated and initialized, but the capability to drive the output terminals will further increase as soon as the sense operation is started and the output terminals are driven. At this moment one of the sense amplifiers increases in its bias current but the other sense amplifier decreases in its bias current, so that the power consumption increases very little despite the enhanced drive capability.

In the sixth and seventh embodiment, the output terminals are previously charged while the sense circuit is non-energized. After the sense operation is started, the precharged voltage is discharged in response to the differential input signal and the bias current is reduced by the voltage decrease in the output terminals. Therefore, the power consumption can be reduced.

As explained above, the present invention makes it possible to provide a sense circuit which reduces the power consumption without decreasing driving capability.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A sense amplifier circuit comprising:
   a power source voltage terminal;
   a reference voltage terminal;
   first and second input terminals;
   an output terminal;
   a first MOS transistor having a source connected to said power source voltage terminal, a gate, and a drain connected to said gate;
   a second MOS transistor having a source connected to said power source voltage terminal, a gate connected to said gate of said first MOS transistor, and a drain;
   a third MOS transistor having a drain connected to said gate of said first MOS transistor, a gate connected to said first input terminal and a source;
   a fourth MOS transistor having a drain connected to said drain of said second MOS transistor and to said output terminal, a gate connected to said second input terminal and a source contended to said source of said third MOS transistor;
   a fifth MOS transistor having a drain connected to said source of said third MOS transistor, a gate connected to said output terminal and a source; and
   a sixth MOS transistor having a drain connected to said source of said fifth MOS transistor, a gate supplied with a sense amplifier enable signal, and a source connected to said reference voltage terminal.

2. A sense amplifier circuit according to claim 1, further comprising:
   a seventh MOS transistor having a conductive path coupled between said drain of said first MOS transistor and said drain of said second MOS transistor, and a gate supplied with the sense amplifier enable signal, for initializing an output of said sense amplifier.

3. A sense amplifier circuit according to claim 1, further comprising:
   a seventh MOS transistor having a conductive path coupled between said drain of said first MOS transistor and said drain of said second MOS transistor, for receiving a sense amplifier signal for initializing an output of said sense amplifier.

4. A sense amplifier circuit enabled in response to a sense amplifier enable signal, comprising:
   first and second power source terminals;
   differential amplifying means, having first and second input terminals and an output terminal, for amplifying and outputting at said output terminal a voltage difference between first and second differential input signals respectively applied to said first and second input terminals, wherein a bias current for biasing said differential amplifying means flows between said first and second power source terminals through said differential amplifying means;
   bias current controlling means, coupled between said differential amplifying means and one of said power source terminals, for controlling the flow of the bias current between said first and second power source terminals through said differential amplifying means, when said sense amplifier circuit is enabled, in accordance with the output at said output terminal of said differential amplifying means; and
   precharging means for precharging said output terminal of said differential amplifying means to a predetermined potential.

5. The sense amplifier circuit according to claim 4, wherein said precharging means comprises a field effect transistor transistor having a current path connected at one end to said output terminal and at a second end to one of said power source terminals and a gate coupled to receive the sense amplifier enable signal.

6. The sense amplifier circuit according to claim 5, wherein the bias current flows in response to a first level of the sense amplifier enable signal sand said precharging means precharges said output terminal to a predetermined potential in response to a second level of the sense amplifier enable signal.

7. A sense amplifier circuit enabled in response to a sense amplifier enable signal, comprising:
first and second power source terminals;
differential amplifying means, having first and second input terminals and an output terminal, for amplifying and outputting at said output terminal a voltage difference between first and second differential input signals respectively applied to said first and second input terminals, wherein a bias current for biasing said differential amplifying means flows between said first and second power source terminals through said differential amplifying means;
bias current controlling means, coupled between said differential amplifying means and one of said power source terminals, for controlling the flow of the bias current between said first and second power source terminals through said differential amplifying means, when said sense amplifier circuit is enabled, in accordance with the output at said output terminal of said differential amplifying means; and
initializing means for initializing a potential at said output terminal of said differential amplifying means.

8. The sense amplifier circuit according to claim 7, wherein said initializing means is responsive to a sense amplifier initializing signal.

9. A sense amplifier circuit enabled in response to a sense amplifier enable signal, comprising:
first and second power source terminals;
differential amplifying means, having first and second input terminals and an output terminal, for amplifying and outputting at said output terminal a voltage difference between first and second differential input signals respectively applied to said first and second input terminals, wherein a bias current for biasing said differential amplifying means flows between said first and second power source terminals through said differential amplifying means;
bias current controlling means, coupled between said differential amplifying means and one of said power source terminals, for controlling the flow of the bias current between said first and second power source terminals through said differential amplifying means, when said sense amplifier circuit is enabled, in accordance with the output at said output terminal of said differential amplifying means, wherein said differential amplifying means comprise first and second differential amplifiers.

10. A sense amplifier circuit enabled in response to a sense amplifier enable signal, comprising:
first and second power source terminals;
first and second differential amplifiers generating outputs at respective output terminals thereof in accordance with first and second differential input signals applied thereto, wherein a first bias current for biasing said first differential amplifier flows between said first and second power source terminals through said first differential amplifier and a second bias current for biasing said second differential amplifier flows between said first and second power source terminals through said second differential amplifier;
a first bias current control circuit, coupled between said first differential amplifier and one of said power source terminals, for controlling the flow of the first bias current between said first and second power terminals through said first differential amplifier, when said sense amplifier is enabled, in accordance with the output at said output terminal of said second differential amplifier; and
a second bias current control circuit, coupled between said second differential amplifier and one of said power source terminals, for controlling the flow of the second bias current between said first and second power terminals through said second differential amplifier, when said sense amplifier is enabled, in accordance with the output at said output terminal of said first differential amplifier.

11. The sense amplifier circuit according to claim 10, wherein said first and second differential amplifiers each comprises:
a current mirror including first and second field effect transistors, a first end of a current path of said first and second field effect transistors coupled to one of said power supply terminals, a gate of said first field effect transistor coupled to a gate of said second field effect transistor and to a second end of the current path of said first field effect transistor;
a third field effect transistor having a current path connected at a first end to a second end of the current path of said first field effect transistor and a gate coupled to receive one of said first and second differential input signal; and
a fourth field effect transistor having a current path connected at a first end to a second end of the current path of said second field effect transistor and at a second end to a second end of the current path of said third field effect transistor and a gate coupled to receive the other of said first and second differential input signals,
wherein an output of said differential amplifier comprises a connection node between said second and fourth field effect transistors.

12. The sense amplifier according to claim 10 further comprising:
means for precharging said output nodes of said first and second differential amplifiers to a predetermined potential.

13. The sense amplifier according to claim 12 wherein said first and second bias current control circuits include means for reducing the bias current to one of said differential amplifiers and means for increasing the bias current to the other of said differential amplifiers when outputs at said output terminals are determined in accordance with the first and second differential input signals.

14. The sense amplifier according to claim 10 further comprising:
initializing means for initializing a potential at said output terminals of said first and second differential amplifiers.

15. The sense amplifier according to claim 10 wherein said first and second bias current control circuits include means for reducing the bias currents in said first and second differential amplifiers when outputs at said output terminals are determined in accordance with the first and second differential input signals.

16. A sense amplifier circuit, comprising:
first and second power source terminals;
a first and second differential amplifier having first and second input terminals and an output terminal, for amplifying and outputting at said output terminal a voltage difference between first and second differential inputs respectively applied to said first and second input terminals thereof, a first bias current for biasing said first differential amplifier flowing between said first and second power source terminals through said first differential amplifier;

a second differential amplifier, having first and second input terminals and an output terminal, for amplifying and outputting at said output terminal a voltage difference between first and second differential inputs respectively applied to said first and second input terminals thereof, a second bias current for biasing said second differential amplifier flowing between said first and second power source terminals through said second differential amplifier;

a first field effect transistor, coupled between said first differential amplifier and one of said power source terminals and having a gate directly connected to said output terminal of said second differential amplifier, for controlling the flow of the first bias current in accordance with the output at said output terminal of said second differential amplifier; and a second field effect transistor, coupled between said second differential amplifier and one of said power source terminals and having a gate to directly connected to said output terminal of said first differential amplifier, for controlling the flow of the second bias current in accordance with the output at said output terminal of said first differential amplifier.

17. The sense amplifier circuit according to claim 16, further comprising:

a first switch, connected between said first field effect transistor and the power source terminal to which said first field effect transistor is coupled, receiving a sense amplifier enable signal for controlling the ON/OFF switching of said first differential amplifier; and a second switch, connected between said second field effect transistor and the power source terminal to which said second field effect transistor is coupled, receiving an enabled signal for controlling the ON/OFF switching of said second differential amplifier.

18. A sense amplifier circuit, comprising:

first and second power source terminals;

a first differential amplifier having first and second input terminals and an output terminal for amplifying and outputting at said output terminal a voltage difference between first and second differential inputs respectively applied to said first and second input terminals thereof, a first bias current for biasing said first differential flowing between said first and second power source terminals through said first differential amplifier;

a second differential amplifier having first and second input terminals and an output terminal for amplifying and outputting at said output terminal a voltage difference between first and second differential inputs respectively applied to said first and second input terminals thereof, a second bias current for biasing said second differential amplifier flowing between said first and second power source terminals through said second differential amplifier;

a first bias current control circuit, coupled between said first differential amplifier and one of said power source terminals, for controlling the flow of the first bias current between said first and second power terminals through said first differential amplifier in accordance with the output at said output terminals of said first and second differential amplifiers, said first bias current control circuit comprising first and second field effect transistors connected in series between said first differential amplifier and said one power source terminal, a gate of said first field effect transistor directly connected to said output terminal of said first differential amplifier and a gate of said second field effect transistor directly connected to said output terminal of said second differential amplifier; and a second bias current control circuit, coupled between said second differential amplifier and one of said power source terminals, for controlling the flow of the second bias current between said first and second power terminals through said second differential amplifier in accordance with the outputs at said output terminals of said first and second differential amplifiers, said second bias control circuit comprising third and fourth field effect transistors connected in series between said second differential amplifiers and said one power source terminal, a gate of said third field effect transistor directly connected to said output terminal of said first differential amplifiers and a gate of said fourth field effect transistor directly connected to said output terminal of said second differential amplifier.

19. The sense amplifier according to claim 18, wherein one end of a current path of said second field effect transistor is connected to one end of a current path of said third field effect transistor.

* * * * *